United States Patent [19]

Landmeier

[11] Patent Number: 4,873,399
[45] Date of Patent: Oct. 10, 1989

[54] INK-ON-GLASS DIGITIZER TABLET AND METHOD OF CONSTRUCTION

[75] Inventor: Waldo L. Landmeier, Scottsdale, Ariz.

[73] Assignee: Calcomp Inc., Anaheim, Calif.

[21] Appl. No.: 286,700

[22] Filed: Dec. 20, 1988

[51] Int. Cl.<sup>4</sup> ............................................. G08C 21/00
[52] U.S. Cl. ..................................................... 178/18
[58] Field of Search .............................. 178/18, 19, 20

[56] References Cited

U.S. PATENT DOCUMENTS 4,725,696 2/1988 Furukawa .............................. 178/18

Primary Examiner—Stafford D. Schreyer
Attorney, Agent, or Firm—Donald A. Streck; Wm. F. Porter, Jr.

[57] ABSTRACT

A digitizer tablet and associated method of construction employing ink-on-glass technology. The method comprises first obtaining substrate having top and bottom surfaces. A plurality of parallel, spaced conductive ink first conductors are applied on the top surface of the substrate with the first conductors terminating in conductive ink pads adajcent a side edge of the substrate. A plurality of parallel, spaced conductive ink second conductors are then applied on the bottom surface of the substrate perpendicular to the first conductors with the second conductors terminating in conductive ink pads adjacent another side edge of the substrate. A flexible connector strip containing a plurality of flexible conductors terminating in conductive pad ends is then placed with the pad ends over respective ones of the conductive ink pads and an electrically conductive adhesive tape is placed between respective ones of the conductive pad ends and the conductive pad end's associated the conductive ink pad. Finally, respective ones of the conductive pad ends are pressed against the conductive pad end's associated conductive ink pad whereby the pad ends are adhesively attached and electrically connected to their associated conductive ink pads.

13 Claims, 3 Drawing Sheets

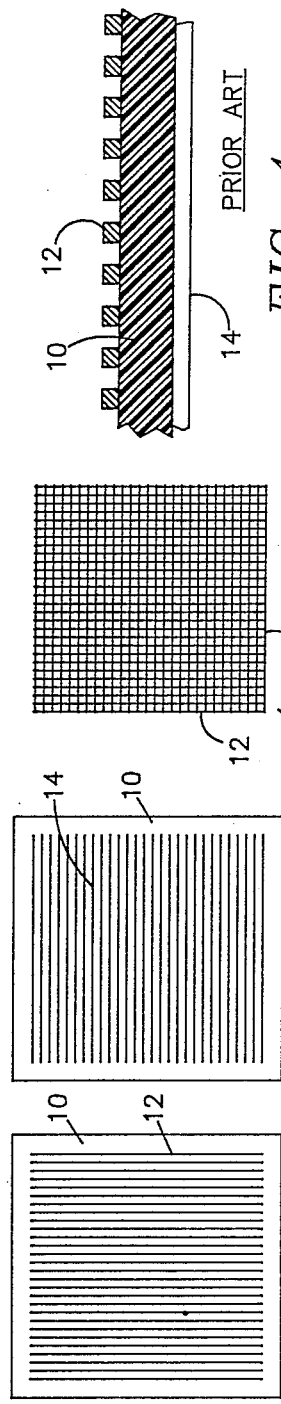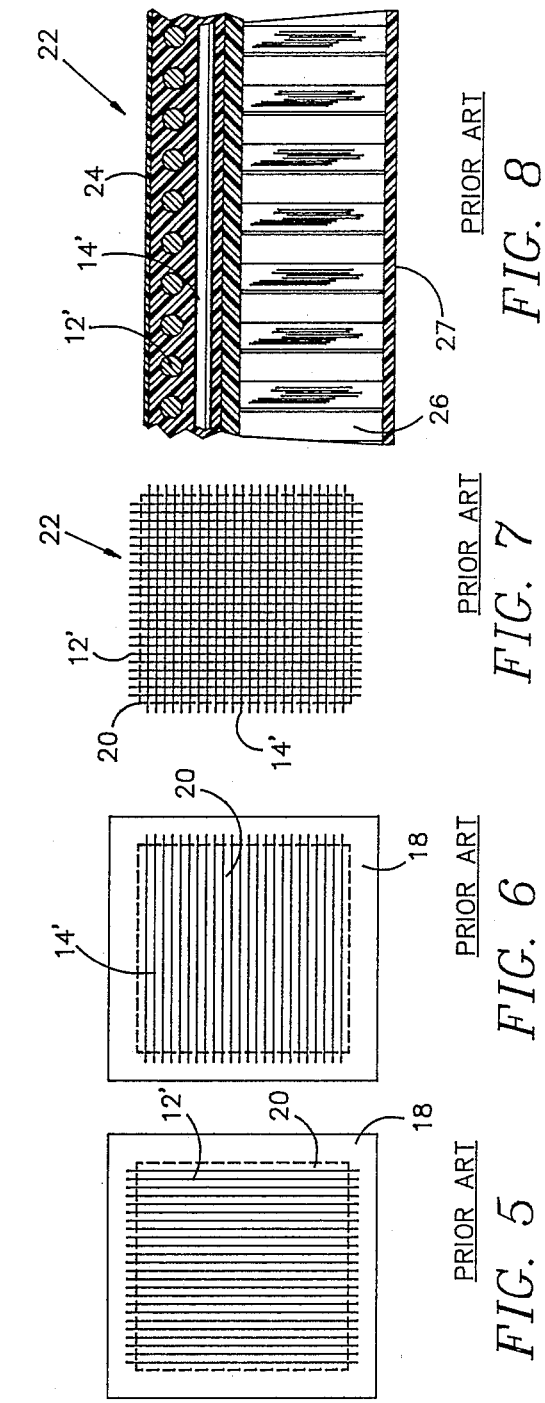

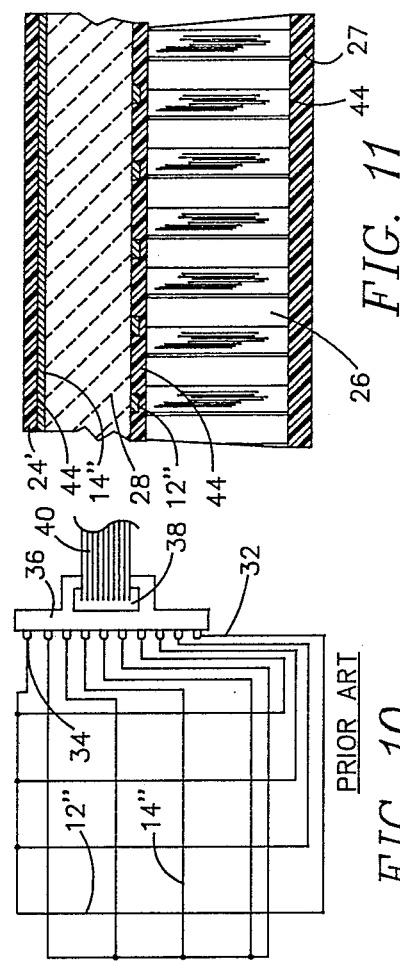
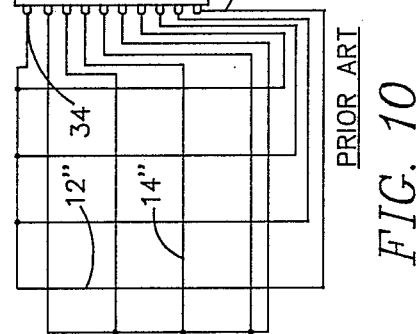
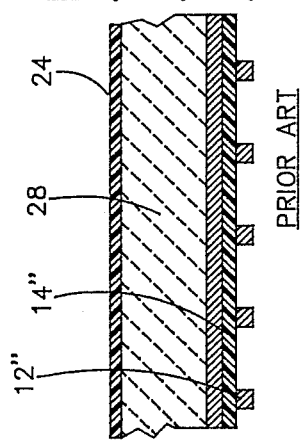
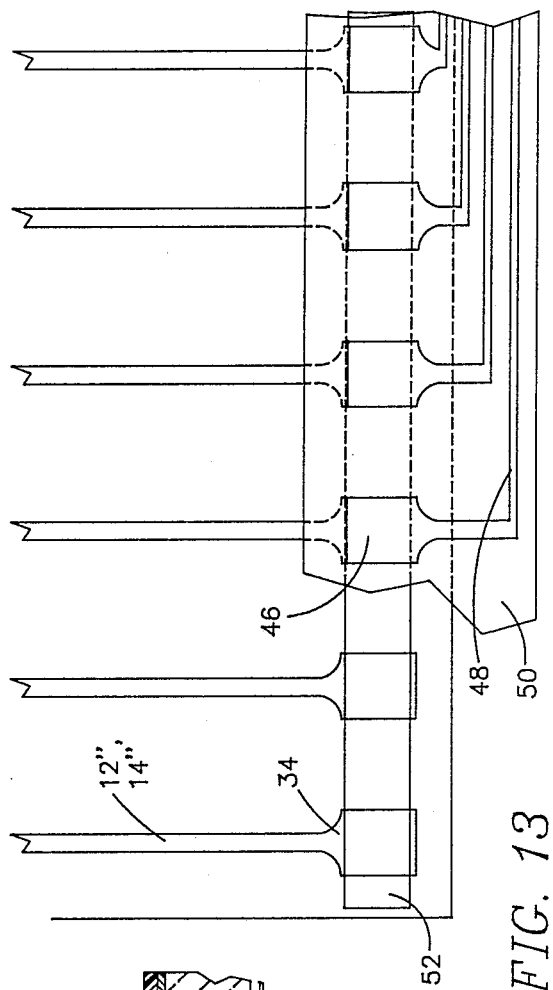
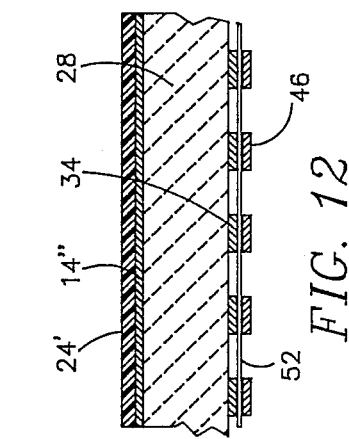

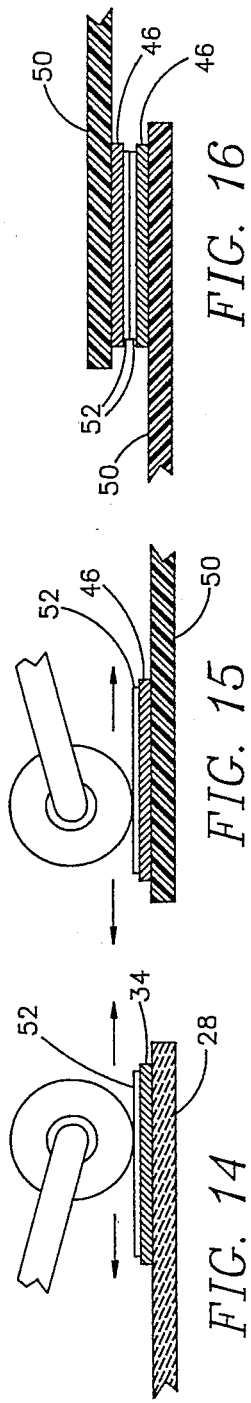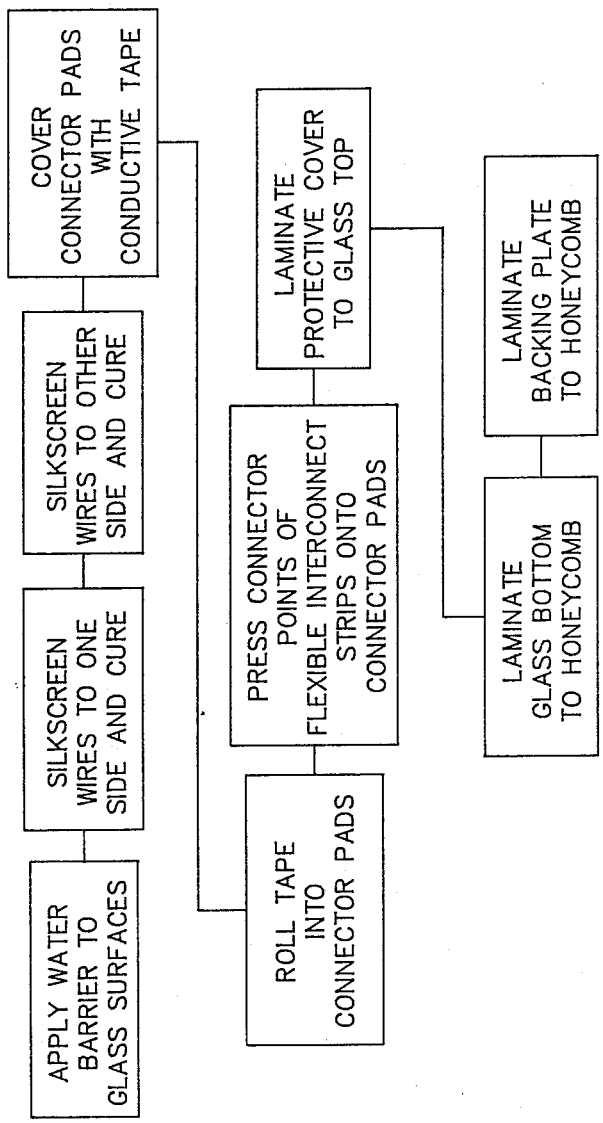

INK-ON-GLASS DIGITIZER TABLET AND METHOD OF CONSTRUCTION

BACKGROUND OF THE INVENTION

The present invention relates to digitizing tablets, and the like, and, more particularly, to a digitzer tablet structure comprising, a glass substrate having top and bottom surfaces; a plurality of parallel, spaced conductive ink first conductors disposed on the top surface of the substrate, the first conductors terminating in conductive ink pads adjacent a side edge of the substrate; a plurality of parallel, spaced conductive ink second conductors disposed on the bottom surface of the substrate perpendicular to the first conductors, the second conductors terminating in conductive ink pads adjacent another side edge of the substrate; a flexible connector strip containing a plurality of flexible conductors terminating in conductive pad ends disposed with the pad ends over respective ones of the conductive ink pads; and, electrically conductive adhesive means disposed between respective ones of the conductive pad ends and the conductive pad end's associated conductive ink pad—wherein, the preferred electrically conductive adhesive means comprises an adhesive tape which is conductive from one outer adhesive surface thereof therethrough to a second outer adhesive surface thereof but which is not conductive longitudinally therealong.

In a digitizing tablet system, a cursor is moved over the surface of a digitizing tablet. The position of the cursor is sensed to develop positional signals that are then input to a computer to accomplish the digitizing purposes of the system. Typically, the tablet contains a grid of horizontal and vertical conductors. In smaller tablets, the conductors can be formed in the manner depicted in FIGS. 1–4. As shown in FIGS. 1 and 2, the tablet contains a substrate 10 of an insulative material having a plurality of parallel, spaced vertical conductors 12 on one side and a plurality of parallel, spaced horizontal conductors 14 on the other side. The conductors 12,14 in combination form a grid 16 as depicted in FIG. 3. The manner in which the conductors 12,14 are carried by and separated by the insulative substrate 10 is depicted in FIG. 4.

In very large digitizing tablet systems, the conductors 12',14' are usually discrete wires that are stretched across the area to be occupied by the tablet and then hand soldered to connectors at the edges in a very labor intensive manufacturing process as depicted in FIGS. 5–8. The wire conductors 12',14' are stretched between pins at the edges of a form 18 and then the form 18 is filled with a resin material 20. After curing and cutting the ends of the conductors 12',14' loose a solid resin grid structure 22 with the conductors 12',14' sealed therein and with their ends as depicted in FIG. 7 is produced. As depicted in the partial cross section drawing of FIG. 8, the top of the grid structure 22 has a plastic surface 24 bonded thereto. Further resin material is employed to bond the grid structure 22 to a honeycomb material 26 (to supply overall rigidity) and to bond the honeycomb material 26 to a backing plate 27. As can be appreciated, the resultant structure is very heavy because of the large quantities of resin contained therein. This is in addition to the high cost of manufacture caused by the above-described labor intensive construction and assembly process.

Recently, the assignee of this application filed co-pending patent application Ser. No. 093,483, filed 09/04/87, entitled DIGITIZING TABLET by Lynn H. Rockwell which is directed to initial work with a digitizing tablet employing conductive ink on a glass substrate referred to as ink-on-glass technology. The teachings of that application are depicted in simplified form in FIGS. 9 and 10. The vertical conductors 12" and horizontal conductors 14" are deposited on the bottom surface of a glass substrate 28 employing a conductive ink in a silkscreening process with an insulative ink 30 between the two layers. Optionally, an layer of the insulative ink 30 can be deposited over the outer (i.e., bottom) conductors (12" or 14") as well to prevent inadvertent shorting thereof. The top surface of the glass substrate 28 (over which a stylus is moved in use) has the same adhesive plastic 24 as described above bonded thereto. As depicted in FIG. 10, the conductors 12",14" are connected to conductive ink traces 32 which terminate in conductive ink pads 34 in a common location. The traces 32 and pads 34 are formed by silkscreening at the same time as the conductors 12",14" to which they are connected. A connector socket 36 is shown to be connected to the pads 34 employing various techniques, including solder or a conductive adhesive which is cured after being disposed between the pads 34 and contacts contained within the socket 36. A plug 38 having a ribbon cable 40 attached thereto is then connected to the socket 36 to connect the conductors 12",14" to the remaining digitizing circuitry. That application contains no further teaching relative to the overall structure of a large digitizer tablet employing the ink-on-glass grid formed by the above-described process. Further, as those skilled in the art will appreciate, the more silkscreening steps that are involved in a manufacturing process and the more complex the pattern formed, the higher the cost and the greater the chance for misformed or broken conductors, or the like. Moreover, with a close-spaced pattern of the traces 32, there is the potential for cross-talk causing improper data readings and other irregularities that can affect the accuracy of the resultant digitizing tablet over its working area.

Wherefore, it is an object of the present invention to provide a structure and method of manufacture for a digitizer tablet employing ink-on-glass components along with the interconnection of their conductors, as necessary, in a manner which is quick and inexpensive to manufacture as well as being compatible with the special nature of the components.

It is another object of the present invention to provide a structure and method of manufacture for a digitizer tablet employing ink-on-glass components and flexible, directly connected interconnecting conductors which is lightweight and reliable.

It is a further object of the present invention to provide a structure and method of manufacture for a digitizer tablet employing ink-on-glass technology which is an improvement over the teachings of patent application Ser. No. 093,483, filed 09/04/87.

Other objects and benefits of the present invention will become apparent from the description which follows hereinafter when taken in conjunction with the drawing figures which accompanying it.

SUMMARY

The foregoing objects have been achieved by the method of the present invention for constructing a digitizer tablet structure employing ink-on-glass technology comprising the steps of, obtaining a glass substrate having top and bottom surfaces; applying a plurality of parallel, spaced conductive ink first conductors on the top surface of the substrate with the first conductors terminating in conductive ink pads adjacent a side edge of the substrate; applying a plurality of parallel, spaced conductive ink second conductors on the bottom surface of the substrate perpendicular to the first conductors with the second conductors terminating in conductive ink pads adjacent another side edge of the substrate; positioning a flexible connector strip containing a plurality of flexible conductors terminating in conductive pad ends with the pad ends over respective ones of the conductive ink pads; disposing electrically conductive adhesive means between respective ones of the conductive pad ends and the conductive pad end's associated conductive ink pad; and, pressing respective ones of the conductive pad ends against the conductive pad end's associated conductive ink pad whereby the pad ends are adhesively attached and electrically connected to their associated conductive ink pads.

In the preferred embodiment, the step of disposing electrically conductive adhesive means between respective ones of the conductive pad ends and the conductive pad end's associated the conductive ink pad comprises the steps of disposing an adhesive tape which is conductive from one outer adhesive surface thereof therethrough to a second outer adhesive surface thereof but which is not conductive longitudinally therealong on the conductive pad ends and rolling the tape with a roller to firmly bond the tape to the conductive pad ends.

The preferred method also includes the steps of (1) applying a first adhesive film having adhesive surfaces on two sides over the top surface of the substrate and the first conductors and applying a layer of a plastic material over the first adhesive film; (2) applying a second adhesive film having adhesive surfaces on two sides over the bottom surface of the substrate and the second conductors and attaching a layer of a lightweight rigid material such as honeycomb to the second adhesive film; and, (3) applying a third adhesive film having adhesive surfaces on two sides over an exposed surface of the honeycomb material and attaching a backing plate to the third adhesive film.

DESCRIPTION OF THE DRAWINGS

FIG. 1 is a simplified drawing of the top surface of a prior art digitizing tablet's inner substrate showing the vertical conductors thereon used for detecting the X-axis position of a cursor thereon.

FIG. 2 is a simplified drawing of the bottom surface of a prior art digitizing tablet's inner substrate showing the horizontal conductors thereon used for detecting the Y-axis position of a cursor thereon.

FIG. 3 is a simplified drawing showing the grid formed by the horizontal and vertical conductors of FIGS. 1 and 2.

FIG. 4 is a simplified cutaway drawing through the substrate and conductors of FIGS. 1 and 2.

FIG. 5 is a simplified drawing of a form employed in manufacturing a large prior art digitizing tablet showing the vertical wire conductors thereon used for detecting the X-axis position of a cursor thereon.

FIG. 6 is a simplified drawing of a form employed in manufacturing a large prior art digitizing tablet showing the horizontal wire conductors thereon used for detecting the Y-axis position of a cursor thereon.

FIG. 7 is a simplified drawing showing the resin grid formed by the horizontal and vertical conductors of FIGS. 5 and 6 by filling the form with a liquid resin and then curing the resin.

FIG. 8 is a simplified cutaway drawing through a large prior art digitizing tablet employing the resin grid of FIG. 7.

FIG. 9 is a simplified cutaway drawing through a prior art digitizing tablet grid employing ink-on-glass technology.

FIG. 10 is a simplified drawing of the connector approach employed in the prior art ink-on-glass digitizing tablet of FIG. 9.

FIG. 11 is a simplified cutaway drawing through a large digitizing tablet according to the present invention in its preferred embodiment.

FIG. 12 is a simplified cutaway drawing through a digitizing tablet grid according to the present invention in its preferred embodiment.

FIG. 13 is a simplified partially cutaway drawing through the connections to a digitizing tablet grid according to the present invention in its preferred embodiment.

FIG. 14 is a simplified drawing depicting the preferred method of assuring maximum adhesion of the conductive tape employed in the preferred embodiment of the present invention.

FIG. 15 is a duplicate of the drawing of FIG. 14 depicting a method of assuring maximum adhesion between components when using conductive tape as employed in an alternate embodiment of the present invention.

FIG. 16 depicts the components of FIGS. 14 and 15 joined by conductive tape when employing the alternate embodiment of the present invention.

FIG. 17 is a block diagram of the steps of the method of the present invention.

DESCRIPTION OF THE PREFERRED EMBODIMENT

A portion of a large size digitizer tablet according to the present invention as intended to replace the above-described tablet of FIG. 8 and its method of manufacture is shown in FIGS. 11 and 12. A rectangular glass substrate 28 has conductive ink conductors 12" and 14" applied to respective opposite surfaces by a silkscreening process and then cured in the manner taught by the manufacture thereof. Such inks are commercially available and well known in the art and, therefore, this aspect of the process will not be described in greater detail in the interest of simplicity. As depicted in FIG. 13, the conductors 12" and 14" terminate in conductive ink pads 34 adjacent the edges 42 of the glass substrate between which they extend. A protective sheet of plastic 24' is laminated by means of an adhesive film 44 to what will be the top surface of the glass substrate 28. The film 44 is applied directly over the conductors (12" or 14"). A similar adhesive film 44 (also applied directly over the other conductors 12" or 14") is employed to attach the above-described grid components to a honeycomb 26 and the honeycomb 26 to a backing plate 27. As those skilled in the art will appreciate, the honeycomb 26 is employed to provide rigidity to the overall structure and, while preferred because of its light weight for a given rigidity, it could be replaced by another material providing the same attributes.

The preferred manner of making electrical connection to the conductors 12" and 14" is shown in FIGS. 12 and 13. Both bonding and electrical connection between the pads 34 and matching conductive pad ends 46 on conductors 48 contained within a flexible Mylar connector strip 50 is affected by means of a so-called conductive adhesive transfer tape commercially available from the 3M Company and sold as Scotch brand tape type number 9702 which has certain properties which are particularly adapted to solving the requirements of the present invention. The tape 52 is provided in elongated strips and has an adhesive surface 54 on both sides. Moreover, the tape 52 has the quality of being electrically conductive from one side of the tape of the other through the tape but not longitudinally along the tape.

In working with the tape 52 and the conductive ink, the applicants herein fournd that improved performance could be achieved by employing novel methods devised by the applicants. In the case of the tape, such improved performance was obtained by methods completely contrary to the teachings of the manufacture of the tape as will be described in greater detail shortly.

The steps of the preferred overall method for producing a large size digitizer tablet of low cost-to-manufacture and light weight are depicted in FIG. 17. The first step is the application of a water barrier to the surfaces of the glass substrate 28. This is accomplished by, for example, washing the glass substrate 28 with a Xcylane wash which cleans the surface of the glass substrate 28 and leaves a bonding agent behind on the surface which acts as a water barrier. Without the formation of the water barrier (i.e. by merely cleaning the surfaces of the substrate 28 with a commercial glass cleaner or otherwise), the conductive ink when applied and cured according to the manufacturer's specifications seemed to adhere adequately; but, under high ambient humidity conditions, resulted in conductors 12",14" which could be easily broken by mild scratching. By employing the water barrier-producing wash prior to application of the ink by silkscreening, the resultant conductors 12",14" as produced are virtually immune to destruction by scratching regardless of the ambient humidity conditions.

Once the glass of the substrate 28 has been cleaned and the water barrier formed, the conductors 12" and conductive pads 34 are applied to one side and cured and then the conductors 14" and conductive pads 34 are applied to the other side and cured. The Mylar connector strips 50 are then applied by first covering the pads 34 with the tape 52, then rolling the tape 52 into firm contact with the pads 34 as depicted in FIG. 14, and then pressing the pad ends 46 of the connector strips 50 onto the tape 52 at each pad 34. The rolling procedure was developed by the applicants herein when it was found that the tape 52 as supplied by the manufacture did not work well for its intended purpose within the environment of the present invention when merely placed between components to be fastened (and electrically connected) and the components pressed together. With out the rolling process that was developed to solve the problem, there was an unacceptably high failure rate at the points of connection.

While it was found that the rolling process improved the bonding of the tape 52 to the pads 34 and the glass of the substrate 28 and that the pad ends 46 and the Mylar of the strips 50 adhered to the rolled tape 52 on the glass substrate 28 to an acceptable degree, it was found that the tape 52 was virtually useless for bonding pad ends 46 of two Mylar connector strips 50 together. This is a situation which may occur because of size of manufacture limitations in the manufacturing of the strips 50; that is, it may be impossible to make a strip 50 of sufficient length to extend along the entire edge 42 of the substrate 28. In the alternative, it may be required or desired to have a connective strip 50 of L-shape which can extend along to adjoining edge 42 and such an extended length and shape may be impossible of manufacture. In either case, the strips 50 must be made in sections and the sections joined by connecting pad ends 46 formed thereon at overlapping ends using the tape 52. When the tape 52 was placed between the pad ends 46 and the pad ends 46 merely pressed together as recommended by the manufacturer, the joint failure rate was unacceptable. When the tape 52 was rolled into one pad end 46 and the the other pad end 46 was pressed onto the first pad end 46, the failure rate was even greater. According to the manufacture, two layers of the tape 52 should never be employed as the electrical conductive nature of the tape from outer surface to outer surface between the two layers would be destroyed because of the nature and construction of the tape. After numerous unsuccessful attempts to achieve a satisfactory adhesive and electrical bond employing the manufacturer's instructions for use, the applicants herein went contrary to the manufacturer's admonition and employed two layers of the tape 52 in the manner depicted in FIGS. 14–16—with completely satisfactory results. Pieces of the tape 52 are rolled into respective ones of the pad ends 46 and adjacent Mylar of the strips 50 to be connected as depicted in FIGS. 14 and 15. After rolling to adhere the tape 52 to the strips 50 and pad ends 46, the two pieces of tape 52 are pressed together as shown in FIG. 16. It is surmised by the inventors herein that the rolling process performs two functions. First, it drives parting agent on the surface of the tape 52 employed to keep it from sticking to the paper tape upon which it is removably attached for storage, delivery, and application into the body of the tape 52 adjacent the adhesive outer surface thereof. Second, it causes some realignment of the conductive particles contained in the tape 52. As a result, the adhesive quality to other surfaces is diminished; however, the tape 52 is highly adhesive to other pieces of the tape 52. Moreover, because of the realigned nature of the conductive particles, two rolled layers of the tape 52 are rendered conductive from outer surface to outer surface, contrary to the expectations of the manufacturer.

After the connective strips 52 have been attached to the pad 34 (and to each other as necessary) employing the tape 52 in the preferred manner described above, the protective sheet of plastic 24' is laminated to what will be the top surface of the glass substrate 28 and the above-described grid components to a honeycomb 26 and the honeycomb 26 to a backing plate 27 as previously mentioned employing an adhesive film 44. The preferred adhesive film 44 is a Mylar film having adhesive on both sides and replaces the resin or other adhesive material employed in the prior art. This type of adhesive film is well known in the art for various other purposes and is virtually weight free in addition to being simple and easy to use. Within the lightweight environment provided by the structure of the present invention, it works well for its intended purpose and adds virtually no weight to the structure itself.

Wherefore, having thus described the present invention, what is claimed is:

1. A digitizer tablet structure comprising:

(a) a glass substrate having top and bottom surfaces;
(b) a plurality of parallel, spaced conductive ink first conductors disposed on said top surface of said substrate, said first conductors terminating in conductive ink pads adjacent a side edge of said substrate;
(c) a plurality of parallel, spaced conductive ink second conductors disposed on said bottom surface of said substrate perpendicular to said first conductors, said second conductors terminating in conductive ink pads adjacent another side edge of said substrate;
(d) a flexible connector strip containing a plurality of flexible conductors terminating in conductive pad ends disposed with said pad ends over respective ones of said conductive ink pads; and,
(e) electrically conductive adhesive means disposed between respective ones of said conductive pad ends and said conductive pad end's associated said conductive ink pad.

2. The digitizer tablet structure of claim 1 wherein: said electrically conductive adhesive means comprises an adhesive tape which is conductive from one outer adhesive surface thereof therethrough to a second outer adhesive surface thereof but which is not conductive longitudinally therealong.

3. The digitizer tablet structure of claim 1 and additionally comprising:
a layer of a plastic material adhesively attached over said top surface of said substrate and said first conductors.

4. The digitizer tablet structure of claim 3 and additionally comprising:
a layer of a lightweight rigid material adhesively attached over said bottom surface of said substrate and said second conductors.

5. The digitizer tablet structure of claim 4 wherein: said layer of a lightweight rigid material is a honeycomb material.

6. The digitizer tablet structure of claim 5 and additionally comprising:
a backing plate adhesively attached over said honeycomb material.

7. The method of constructing a digitizer tablet structure employing ink-on-glass technology comprising the steps of:
(a) obtaining a glass substrate having top and bottom surfaces;
(b) applying a plurality of parallel, spaced conductive ink first conductors on the top surface of the substrate with the first conductors terminating in conductive ink pad adjacent a side edge of the substrate;
(c) applying a plurality of parallel, spaced conductive ink second conductors on the bottom surface of the substrate perpendicular to the first conductors with the second conductors terminating in conductive ink pads adjacent another side edge of the substrate;
(d) positioning a flexible connector strip containing a plurality of flexible conductors terminating in conductive pad ends with the pad ends over respective ones of the conductive ink pads;
(e) disposing electrically conductive adhesive means between respective ones of the conductive pad ends and the conductive pad end's associated the conductive ink pad; and,
(f) pressing respective ones of the conductive pad ends against the conductive pad end's associated conductive ink pad whereby the pad ends are adhesively attached and electrically connected to their associated conductive ink pads.

8. The method of claim 7 wherein said step (e) of disposing electrically conductive adhesive means between respective ones of the conductive pad ends and the conductive pad end's associated the conductive ink pad comprises the steps of:
(a) disposing an adhesive tape which is conductive from one outer adhesive surface thereof therethrough to a second outer adhesive surface thereof but which is not conductive longitudinally therealong on the conductive pad ends; and,
(b) rolling the tape with a roller to firmly bond the tape to the conductive pad ends.

9. The method of claim 7 and additionally comprising the steps of:
(a) applying a first adhesive film having adhesive surfaces on two sides over the top surface of the substrate and the first conductors; and,
(b) applying a layer of a plastic material over the first adhesive film.

10. The method of claim 9 and additionally comprising the steps of:
(a) applying a second adhesive film having adhesive surfaces on two sides over the bottom surface of the substrate and the second conductors; and,
(b) attaching a layer of a lightweight rigid material to the second adhesive film.

11. The method of claim 10 wherein said step (b) of attaching a layer of a lightweight rigid material to the second adhesive film comprises:
attaching a honeycomb material to the second adhesive film.

12. The method of claim 11 and additionally comprising:
(a) applying a third adhesive film having adhesive surfaces on two sides over an exposed surface of the honeycomb material; and,
(b) attaching a backing plate to the third adhesive film.

13. The method of physically and electrically connecting a connector on a first substrate terminating in an electrically conductive first pad end to a connector on a second substrate terminating in an electrical conductive second pad end comprising the steps of:
(a) disposing a first adhesive tape which is conductive from one outer adhesive surface thereof therethrough to a second outer adhesive surface thereof but which is not conductive longitudinally therealong on the first conductive pad ends;
(b) rolling the first tape with a roller to firmly bond the first tape to the conductive first pad end;
(c) disposing a second adhesive tape which is conductive from one outer adhesive surface thereof therethrough to a second outer adhesive surface thereof but which is not condutive longitudinally therealocng on the second conductive pad ends;
(d) rolling the second tape with a roller to firmly bond the second tape to the conductive second pad end;
(e) positioning the first pad end over the second pad end with the first and second tapes facing one another; and,
(f) pressing the first and second pads together to force the first and second tapes into adhesive and conductive relationship with one another.

* * * * *